(12) United States Patent
Nakagawa et al.

(10) Patent No.: US 9,029,987 B2
(45) Date of Patent: May 12, 2015

(54) LASER MACHINING METHOD AND CHIP

(71) Applicant: Hamamatsu Photonics K.K., Hamamatsu-shi, Shizuoka (JP)

(72) Inventors: Aiko Nakagawa, Hamamatsu (JP); Takeshi Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/305,773

(22) Filed: Jun. 16, 2014

(65) Prior Publication Data

US 2014/0291813 A1 Oct. 2, 2014

Related U.S. Application Data

(62) Division of application No. 13/387,261, filed as application No. PCT/JP2010/063879 on Aug. 17, 2010, now Pat. No. 8,790,997.

(30) Foreign Application Priority Data

Aug. 21, 2009 (JP) ................................. 2009-192340

(51) Int. Cl.
*H01L 23/544* (2006.01)
*H01L 23/00* (2006.01)
*B23K 26/38* (2014.01)
*B23K 26/40* (2014.01)
*B23K 26/00* (2014.01)
(Continued)

(52) U.S. Cl.
CPC ............. *H01L 23/562* (2013.01); *B23K 26/38* (2013.01); *B23K 26/4075* (2013.01); *H01L 21/67092* (2013.01); *B23K 26/0057* (2013.01); *B23K 26/046* (2013.01); *B23K 2201/40* (2013.01); *H01L 2924/0002* (2013.01)

(58) Field of Classification Search
USPC .................................................. 257/684, 730
See application file for complete search history.

(56) References Cited

U.S. PATENT DOCUMENTS 6,992,026 B2 1/2006 Fukuyo et al.
7,626,137 B2 12/2009 Fukuyo et al.
(Continued)

FOREIGN PATENT DOCUMENTS

CN 1796064 A 7/2006
CN 1803374 A 7/2006
(Continued)

*Primary Examiner* — Earl Taylor
(74) *Attorney, Agent, or Firm* — Drinker Biddle & Reath LLP

(57) ABSTRACT

While reliably cutting an object to be processed, the strength of the resulting chips is improved. An object to be processed 1 is irradiated with laser light L, so as to form modified regions 17, 27, 37, 47 extending along lines to cut 5 and aligning in the thickness direction in the object 1. Here, modified regions 17 are formed such that modified region formed parts 17a and modified region unformed parts 17b alternate along the lines, and modified regions 47 are formed such that modified region formed parts 47a and modified region unformed parts 47b alternate along the lines. This can inhibit formed modified regions 7 from lowering the strengths on the rear face 21 side and front face 3 side of chips obtained by cutting. On the other hand, modified regions 27, 37 located between the modified regions 17, 47 are formed continuously from one end side of the lines 5 to the other end side thereof, whereby the cuttability of the object 1 can be secured reliably.

2 Claims, 19 Drawing Sheets

(51) Int. Cl.
*B23K 26/04* (2014.01)
*H01L 21/67* (2006.01)

(56) References Cited

U.S. PATENT DOCUMENTS

| | | | |
|---|---|---|---|
| 7,709,767 | B2 | 5/2010 | Sakamoto |
| 7,732,730 | B2 | 6/2010 | Fukuyo et al. |
| 7,825,350 | B2 | 11/2010 | Fukuyo et al. |
| 7,897,487 | B2 | 3/2011 | Sugiura et al. |
| 7,947,574 | B2 | 5/2011 | Sakamoto et al. |
| 8,389,384 | B2 | 3/2013 | Sakamoto et al. |
| 2004/0002199 | A1 | 1/2004 | Fukuyo et al. |
| 2005/0067392 | A1 | 3/2005 | Nagai et al. |
| 2005/0202596 | A1 | 9/2005 | Fukuyo et al. |
| 2005/0272223 | A1 | 12/2005 | Fujii et al. |
| 2006/0011593 | A1 | 1/2006 | Fukuyo et al. |
| 2006/0148212 | A1 | 7/2006 | Fukuyo et al. |
| 2006/0255024 | A1 | 11/2006 | Fukuyo et al. |
| 2007/0125757 | A1 | 6/2007 | Fukuyo et al. |
| 2007/0158314 | A1 | 7/2007 | Fukumitsu et al. |
| 2009/0004828 | A1 | 1/2009 | Kobayashi |
| 2010/0240159 | A1 | 9/2010 | Kumagai et al. |
| 2010/0258539 | A1 | 10/2010 | Sakamoto |
| 2011/0027971 | A1 | 2/2011 | Fukuyo et al. |
| 2011/0027972 | A1 | 2/2011 | Fukuyo et al. |
| 2011/0037149 | A1 | 2/2011 | Fukuyo et al. |
| 2011/0274128 | A1 | 11/2011 | Fukumitsu et al. |
| 2012/0119334 | A1 | 5/2012 | Nakagawa et al. |

FOREIGN PATENT DOCUMENTS

| | | |
|---|---|---|
| JP | S61-033785 | 2/1986 |
| JP | 2003-338467 A | 11/2003 |
| JP | 2004-106009 | 4/2004 |
| JP | 2006-140356 A | 6/2006 |
| JP | 2007-130768 A | 5/2007 |
| JP | 2007-142000 A | 6/2007 |
| JP | 2009-23215 | 2/2009 |
| JP | 2009-25995 | 2/2009 |
| JP | 2009-50892 | 3/2009 |
| JP | 2010-3817 | 1/2010 |

Fig.8
(a)
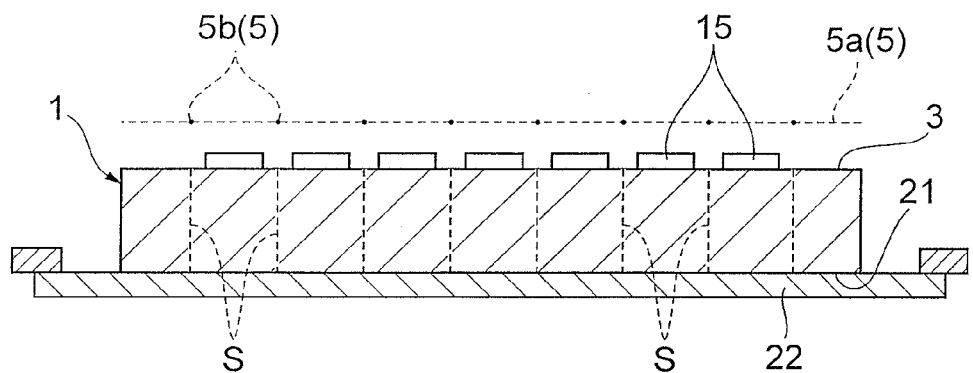
(b)
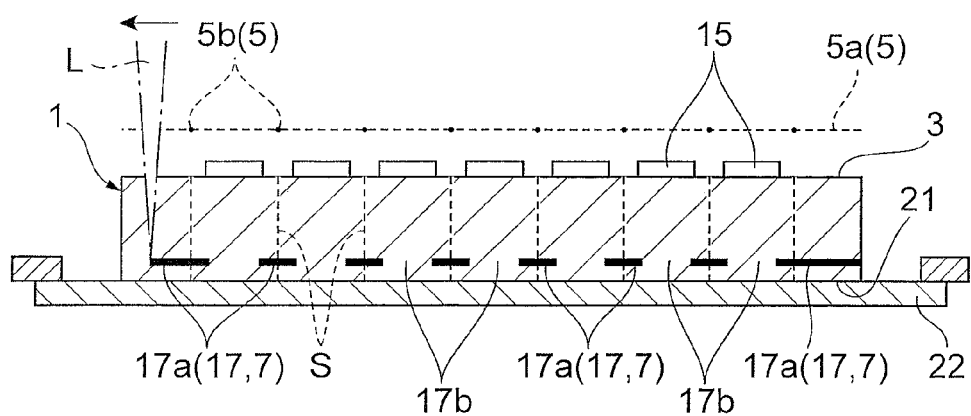

Fig.13

|  | Chip C1 | | Conventional chip | |
|---|---|---|---|---|
| Open surface / Test No. | Rear | Entrance | Rear | Entrance |
| No.1 | 86.9 [N] | 23.9 [N] | 20.8 [N] | 52.8 [N] |
| No.2 | 50.0 [N] | 118 [N] | 22.7 [N] | 59.6 [N] |
| No.3 | 121.8 [N] | 104.7 [N] | 24.3 [N] | 57.6 [N] |
| No.4 | 92.8 [N] | 83.4 [N] | 18.9 [N] | 31.7 [N] |
| No.5 | 32.6 [N] | 107.2 [N] | 25.8 [N] | 64.2 [N] |
| No.6 | 68.9 [N] | 55.8 [N] | 25.4 [N] | 48.7 [N] |
| No.7 | 74.6 [N] | 40.8 [N] | 20.6 [N] | 50.3 [N] |
| No.8 | 45.7 [N] | 110.4 [N] | 22.5 [N] | 50.3 [N] |
| No.9 | 90.2 [N] | 111.6 [N] | 24.6 [N] | 39.8 [N] |
| No.10 | 80.0 [N] | 72.7 [N] | 18.6 [N] | 51.8 [N] |
| average | 74.3 [N] | 82.8 [N] | 22.4 [N] | 50.7 [N] |

Fig. 17
(a)
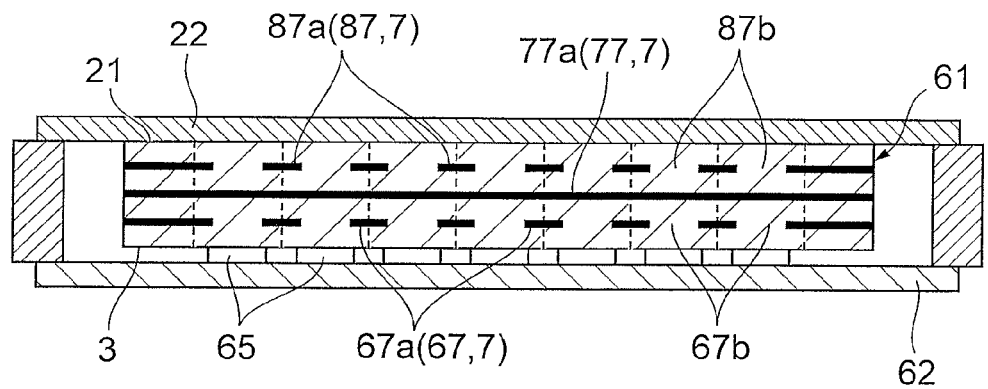
(b)
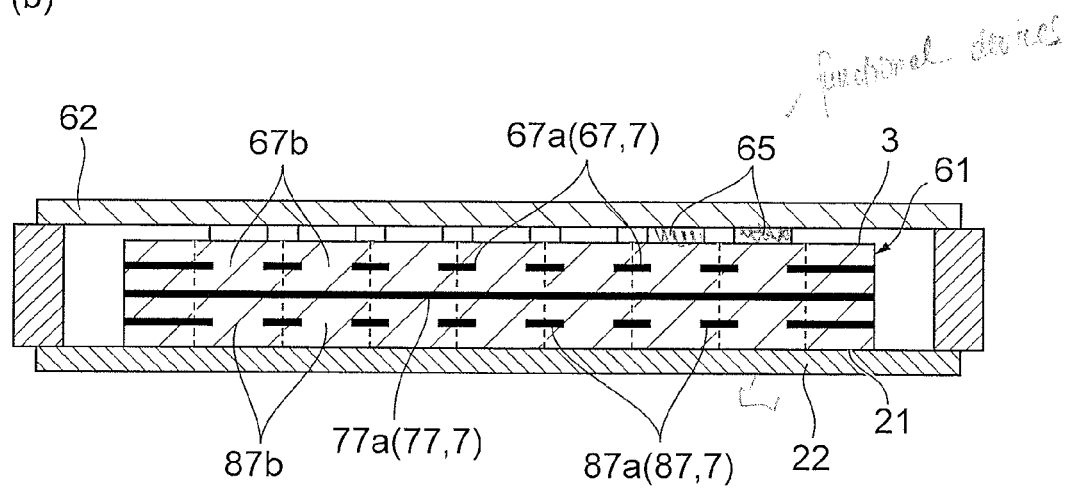

LASER MACHINING METHOD AND CHIP

CROSS-REFERENCE TO RELATED APPLICATIONS

This application is a divisional of U.S. application Ser. No. 13/387,261, filed Jan. 26, 2012, the entire contents of which is incorporated herein by reference. U.S. application Ser. No. 13/387,261 is a 35 U.S.C. §371 of PCT/JP2010/063879 filed Aug. 17, 2010, which claims the benefit of Japanese Patent Application No. 2009-192340, filed Aug. 21, 2009.

TECHNICAL FIELD

The present invention relates to a laser processing method for cutting an object to be processed into a plurality of chips, and a chip obtained by using this laser processing method.

BACKGROUND ART

Known as a conventional laser processing method is one irradiating an object to be processed with laser light while locating a converging point within the object, so as to form a modified region to become a cutting start point in the object along a line to cut (see, for example, Patent Literature 1). After forming the modified region, such a laser processing method cuts the object into a plurality of chips along the line to cut from the modified region acting as a cutting start point.

CITATION LIST

Patent Literature

Patent Literature 1: Japanese Patent Application Laid-Open No. 2003-338467

SUMMARY OF INVENTION

Technical Problem

There are cases where the chips obtained by using the above-mentioned laser processing method are employed in an environment where a shock may be applied thereto, whereby they are required to improve their strength such as bending strength. It is also desired for the above-mentioned laser processing method to be able to cut the object reliably.

It is therefore an object of the present invention to provide a laser processing method which can reliably cut an object to be processed and improve the strength of the resulting chips, and a chip obtained by using this laser processing method.

Solution to Problem

For achieving the above-mentioned object, the inventors conducted diligent studies and, as a result, have found that there is a case where the strength of the resulting chips is lowered by modified regions formed. The inventors have further found that, since one and the other main face sides of chips are likely to become bases for breakages (cracks), for example, modified regions formed on one and the other main face sides have an influence on the lowering of strength in particular. It leads to an idea that the strength of chips can effectively be improved if the strengths on one and the other main face sides of the chips can be inhibited from being lowered by modified regions, thereby completing the present invention.

That is, the laser processing method in accordance with the present invention is a laser processing method of irradiating a sheet-like object to be processed with laser light while locating a converging point within the object, so as to form a modified region to become a cutting start point in the object along a line to cut; the method comprising a modified region forming step of forming along the line at least a first modified region located on one main face side of the object, a second modified region located on the other main face side of the object, and a third modified region located between the first and second modified regions, the first to third regions aligning in a thickness direction of the object; the modified region forming step including the steps of forming the first modified region such that parts formed with and without the first modified region alternate along the line, forming the second modified region such that parts formed with and without the second modified region alternate along the line, and forming the third modified region such that a part formed with the third modified region exists from one end side to the other end side along the line in the object.

In the laser processing method in accordance with the present invention, parts formed with and without the first modified region on one main face side are formed so as to alternate along the line to cut, while parts formed with and without the second modified region on the other main face side are formed so as to alternate along the line to cut. This can inhibit the strengths on one and the other main face sides of the resulting chips from being lowered by the modified regions formed. On the other hand, the part formed with the third modified region located between the first and second modified regions is formed so as to exist from one end side of the line to the other end side thereof, whereby the cuttability of the object is secured reliably. Hence, the present invention can cut the object reliably and improve the strength of the resulting chips.

Preferably, the parts formed with the first and second modified regions are formed so as to exist in a predetermined part extending along the line and passing a surface to cut the object. In this case, the first and second modified regions can be formed in parts corresponding to edges of the resulting chips. This can secure the straightforwardness of the cut surface.

Here, there is a case where a plurality of functional devices are arranged in a matrix on the main face of the object, the line is set like a grid between the plurality of functional devices, and when the object is seen from a lateral side, the parts formed with the first and second modified regions are formed so as to exist in a part corresponding to between the plurality of functional devices, while the parts formed without the modified regions are formed so as to exist in a part corresponding to a center part of the functional device.

Preferably, the plurality of functional devices each present an elongated form and are arranged in such a matrix as to have the same longitudinal direction, while the parts formed with and without the first and second modified regions alternate along a part of the line extending along the longitudinal direction. When the resulting chips have an elongated form, they are required to improve the bending strength in their longitudinal direction (i.e., breakability at the time when a force is applied to a chip held by both longitudinal end parts thereof) in particular. In this regard, the parts formed with and without the first and second modified regions alternating along the longitudinal line to cut can enhance the bending strength in the longitudinal direction in particular, whereby the above-mentioned effect of improving the strength of chips can be exhibited effectively.

The method may further comprise a cutting step of cutting the object along the line from the first, second, and third modified regions as a cutting start point.

The chip in accordance with the present invention is a chip having side faces substantially parallel to a thickness direction; wherein at least one of the side faces is formed with at least first, second, and third modified regions aligning in the thickness direction and extending in a direction intersecting the thickness direction; wherein, on the one side face, the first modified region is located on one main face side of the chip and formed in one and the other end parts in the intersecting direction; wherein, on the one side face, the second modified region is located on the other main face side of the chip and formed on the one and the other end parts; and wherein, on the one side face, the third modified region is located between the first and second modified regions and formed so as to exist from the one end part to the other end part.

The chip of the present invention can be obtained by using the above-mentioned laser processing method in accordance with the present invention. Here, the first modified region on one main face side and the second modified region on the other main face side are formed along the intersecting direction in one and the other end parts in the intersecting direction. This can inhibit the strengths on one and the other main face sides of the chip from being lowered by modified regions formed and improve the strength of the chip.

Advantageous Effects of Invention

The present invention can reliably cut an object to be processed and improve the strength of the resulting chips.

BRIEF DESCRIPTION OF DRAWINGS

FIG. 8 is a sectional flow diagram taken along the line VIII-VIII of FIG. 7 for explaining the laser processing method of the first embodiment;

FIG. 13 is a chart representing results of bending strength tests for the chip of FIG. 12;

FIG. 17 is a sectional flow diagram for illustrating a sequel to FIG. 16;

DESCRIPTION OF EMBODIMENTS

Figure 1:
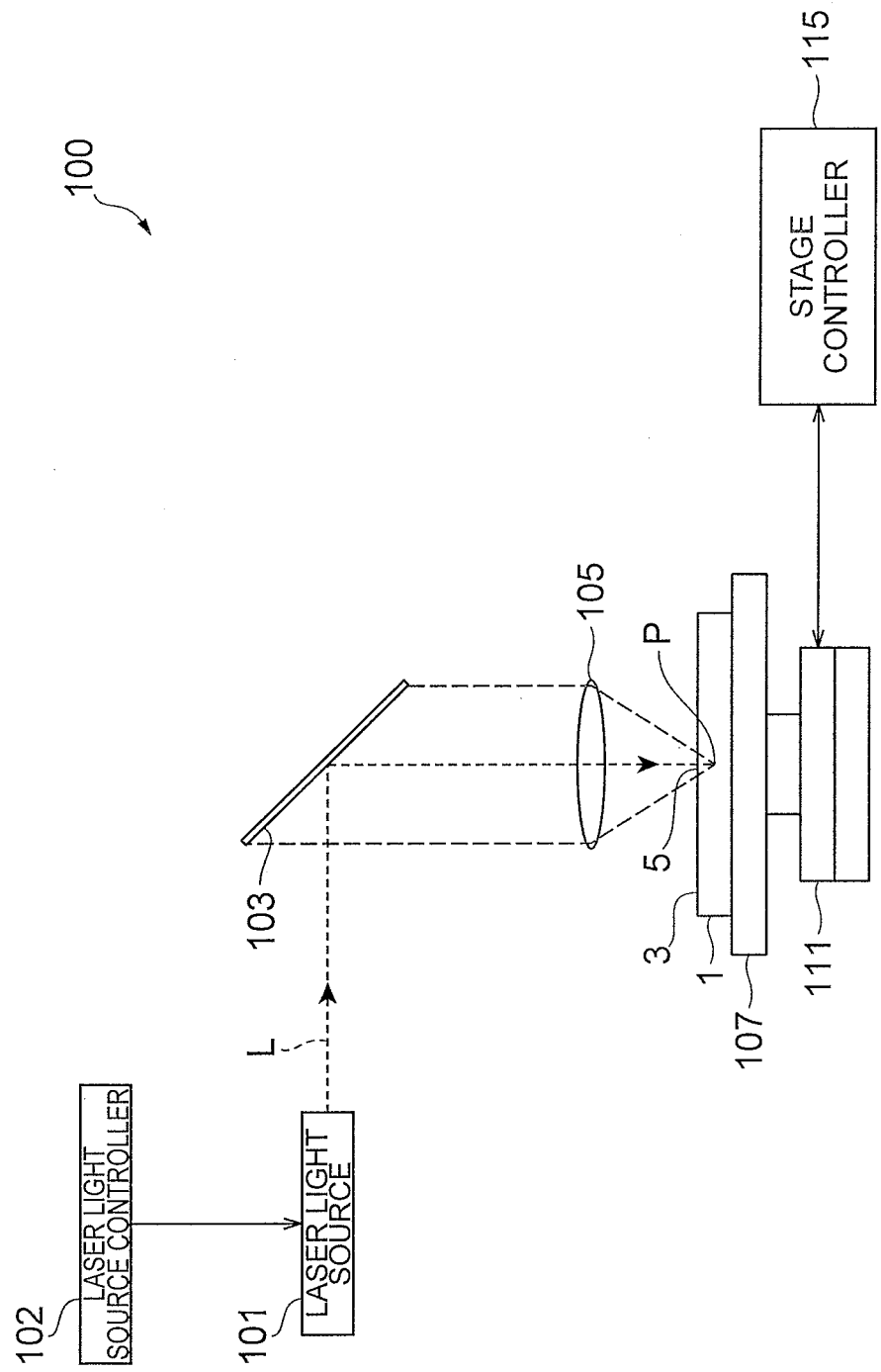
FIG. 1 is a schematic structural diagram of a laser processing apparatus for performing the laser processing method in accordance with an embodiment.

In the following, preferred embodiments of the present invention will be explained in detail with reference to the drawings. In the drawings, the same or equivalent constituents will be referred to with the same signs while omitting their overlapping descriptions. The terms "left" and "right" are based on the states illustrated in the drawings and used only for convenience.

The laser processing apparatus in accordance with an embodiment irradiates an object to be processed with laser light while locating a converging point within the object, so as to form a modified region in the object. Therefore, the forming of the modified region by the laser processing apparatus will firstly be explained with reference to FIGS. 1 to 6.

As illustrated in FIG. 1, a laser processing apparatus 100 comprises a laser light source 101 for causing laser light L to oscillate in a pulsating manner, a dichroic mirror 103 arranged such as to change the direction of the optical axis (optical path) of the laser light L by 90°, and a condenser lens 105 for converging the laser light L. The laser processing apparatus 100 also comprises a support table 107 for supporting an object to be processed 1 which is irradiated with the laser light L converged by the condenser lens 105, a stage 111 for moving the support table 107 along X, Y, and Z axes, a laser light source controller 102 for regulating the laser light source 101 in order to adjust the output, pulse width, and the like of the laser light L, and a stage controller 115 for regulating movements of the stage 111.

In the laser processing apparatus 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to cut 5. This forms a modified region to become a cutting start point in the object 1 along the line 5.

Figure 2:
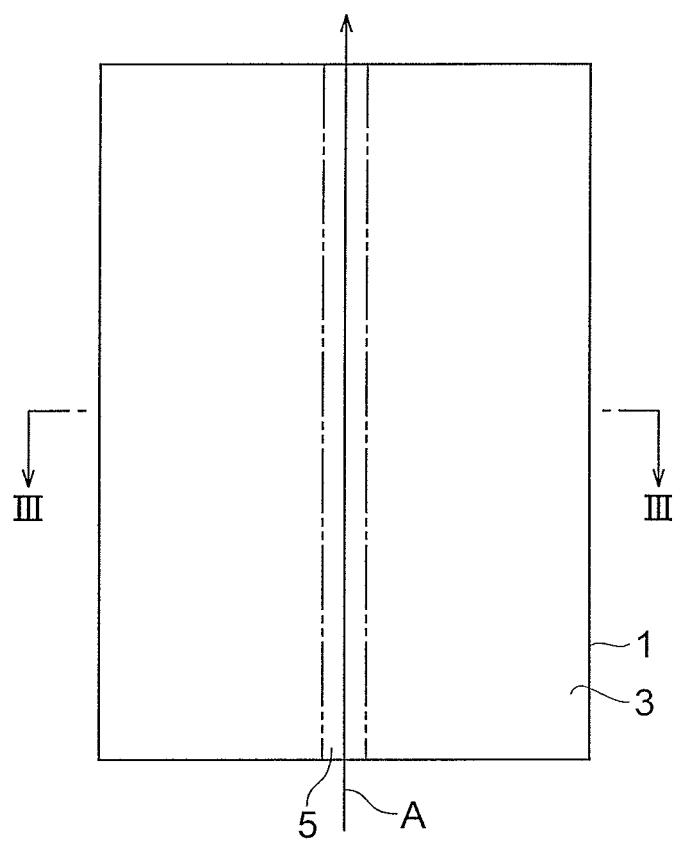
FIG. 2 is a plan view of an example of objects to be processed for which a modified region is formed.
Figure 3:
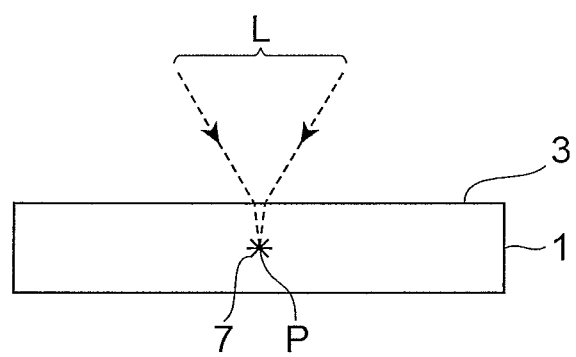
FIG. 3 is a sectional view of the object taken along the line III-III of FIG. 2.
Figure 4:
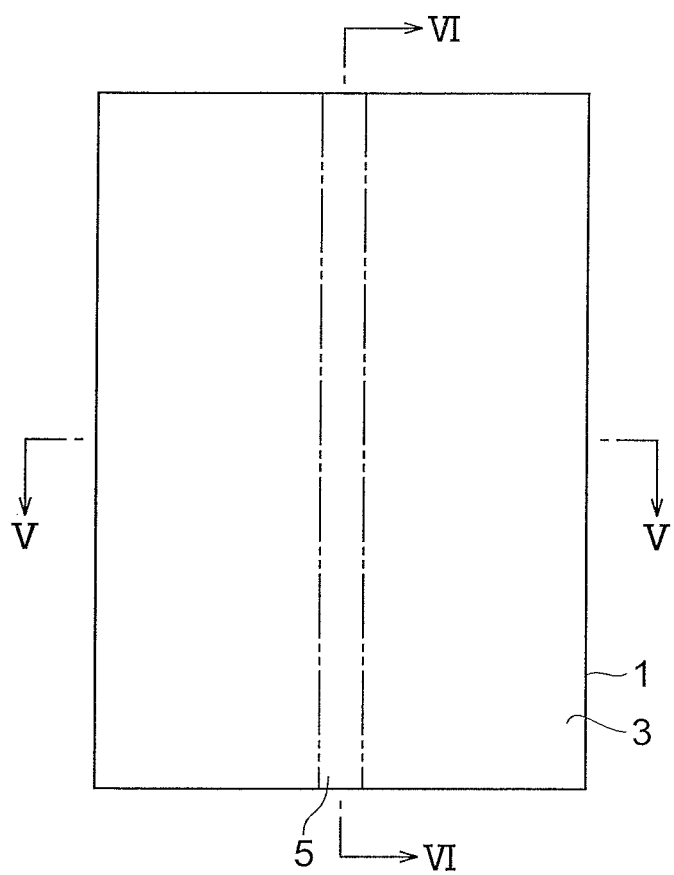
FIG. 4 is a plan view of the object after laser processing.
Figure 5:
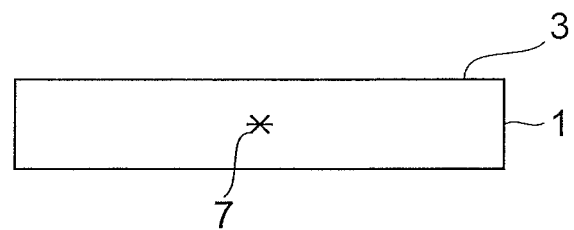
FIG. 5 is a sectional view of the object taken along the line V-V of FIG. 4.
Figure 6:
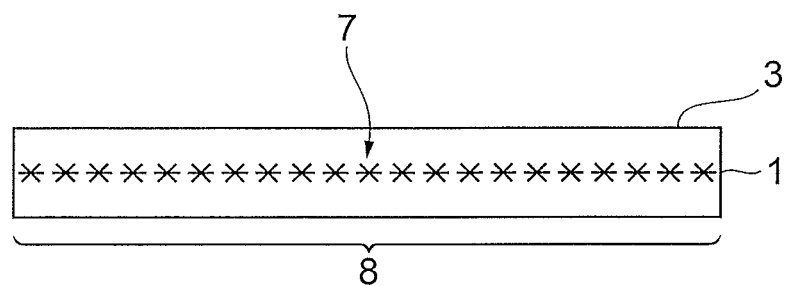
FIG. 6 is a sectional view of the object taken along the line VI-VI of FIG. 4.

A semiconductor material, a piezoelectric material, or the like is used for the object 1, in which the line 5 for cutting the object 1 is set as illustrated in FIG. 2. The line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 formed along the line 5 becomes a cutting start region 8.

The converging point P is a position at which the laser light L is converged. The line 5 may be curved instead of being straight and may be a line actually drawn on the front face 3 of the object 1 without being restricted to the virtual line. The modified region 7 may be formed either continuously or intermittently either in rows or dots. It will be sufficient if the modified region 7 is formed at least partly within the object 1 so as to become a cutting start point. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (internal absorption type laser processing). Therefore, the front face 3 of the object 1 hardly absorbs the laser light L and thus does not melt. In the case of forming a removing part such as a hole or groove by melting it away from the front face 3, the processing region gradually progresses from the front face 3 side to the rear face side in general (surface absorption type laser processing).

The modified region formed by the laser processing apparatus in accordance with this embodiment means regions whose physical characteristics such as density, refractive index, and mechanical strength have attained states different from those of their surroundings. Examples of the modified region include molten processed regions, crack regions, dielectric breakdown regions, refractive index changed regions, and their mixed regions. Further examples of the modified region include an area where the density of the modified region has changed from that of an unmodified region in the material of the object and an area formed with a lattice defect (which can collectively be referred to as a high-density transitional region).

The molten processed regions, refractive index changed regions, areas where the modified region has a density different from that of the unmodified region, and areas formed with a lattice defect may further incorporate a fracture (cut or microcrack) therewithin or at an interface between the modified and unmodified regions. The incorporated fracture may be formed over the whole surface of the modified region or in only a part or a plurality of parts thereof. Examples of the object 1 include those containing or constituted by any of silicon, glass, LiTaO$_3$, and sapphire (Al$_2$O$_3$).

First Embodiment

The laser processing method in accordance with the first embodiment of the present invention will now be explained in detail.

Figure 7:
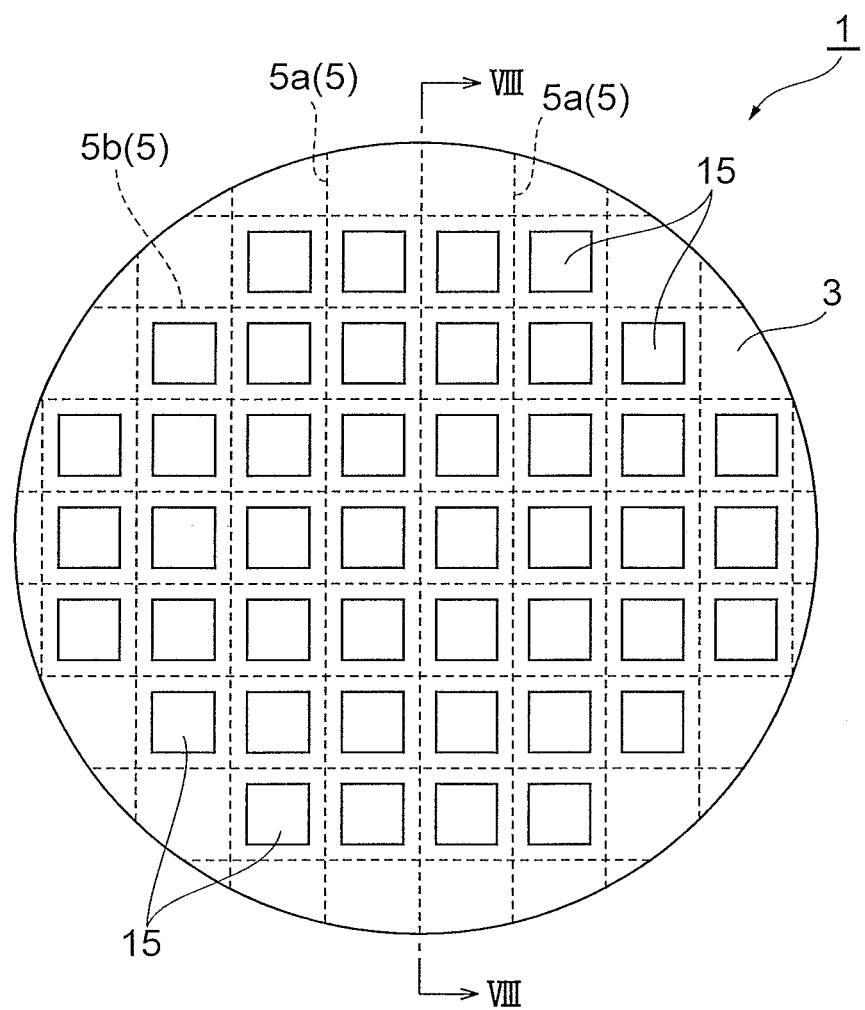
FIG. 7 is a plan view illustrating an object to be processed by the laser processing method of a first embodiment.

In the object 1 to be processed by the laser processing method of this embodiment, a plurality of functional devices 15 are formed on its front face 3 as illustrated in FIG. 7. Examples of the functional devices 15 include semiconductor operating layers formed by crystal growth, light-receiving devices such as photodiodes, light-emitting devices such as laser diodes, and circuit devices formed as integrated circuits. A number of functional devices 15, each of which is formed as a rectangular driver IC (Integrated Circuit) here, are arranged in a matrix.

For example, a substantially disk-shaped silicon substrate is used as the object 1, in which grid-like lines to cut 5 passing between the functional devices 15 adjacent to each other are set. That is, the lines 5 include lines to cut 5a extending along one direction and lines to cut 5b extending along a direction orthogonal to (intersecting) the lines 5a.

The laser processing method of this embodiment forms four rows of modified regions 17, 27, 37, 47 extending along the lines 5 and aligning in the thickness direction in this order from the rear face 21 side to the front face 3 side. The object 1 is cut into a plurality of chips from the modified regions 17, 27, 37, 47 acting as cutting start points. Specifically, as illustrated in FIG. 8(a), the object 1 having an expandable tape 22 attached to its rear face 21 is firstly mounted on the support table 107 (see FIG. 1).

Subsequently, the object 1 is irradiated with the laser light L, while using the front face 3 of the object 1 as a laser light entrance surface and locating the converging point P on the rear face 21 side of the object 1. At the same time, the laser light L is relatively moved (scanned) along the lines 5a. This forms modified regions 17 located on the rear face 21 side of the object 1 within the object 1 along the lines 5a as illustrated in FIG. 8(b).

Here, the laser light source controller 102 regulates the ON/OFF of the emission of the laser light L, so as to form the modified regions 17 such that modified region formed parts 17a which are parts formed with the modified regions 17 and modified region unformed parts 17b which are parts formed without the modified regions 17 alternate along the lines 5a. In other words, the modified region formed parts 17a are intermittently formed along the lines 5a.

More specifically, when the object 1 is seen from a lateral side, the modified region formed parts 17a are formed so as to exist in parts (sections) corresponding to between a plurality of functional devices 15. That is, as parts corresponding to edges of chips after cutting, the modified region formed parts 17a are formed so as to be located in predetermined parts extending by predetermined lengths along the lines 5a and passing surfaces to cut S. On the other hand, the modified region unformed parts 17b are formed so as to exist in parts (sections) corresponding to the center parts of the functional devices 15.

Figure 9:
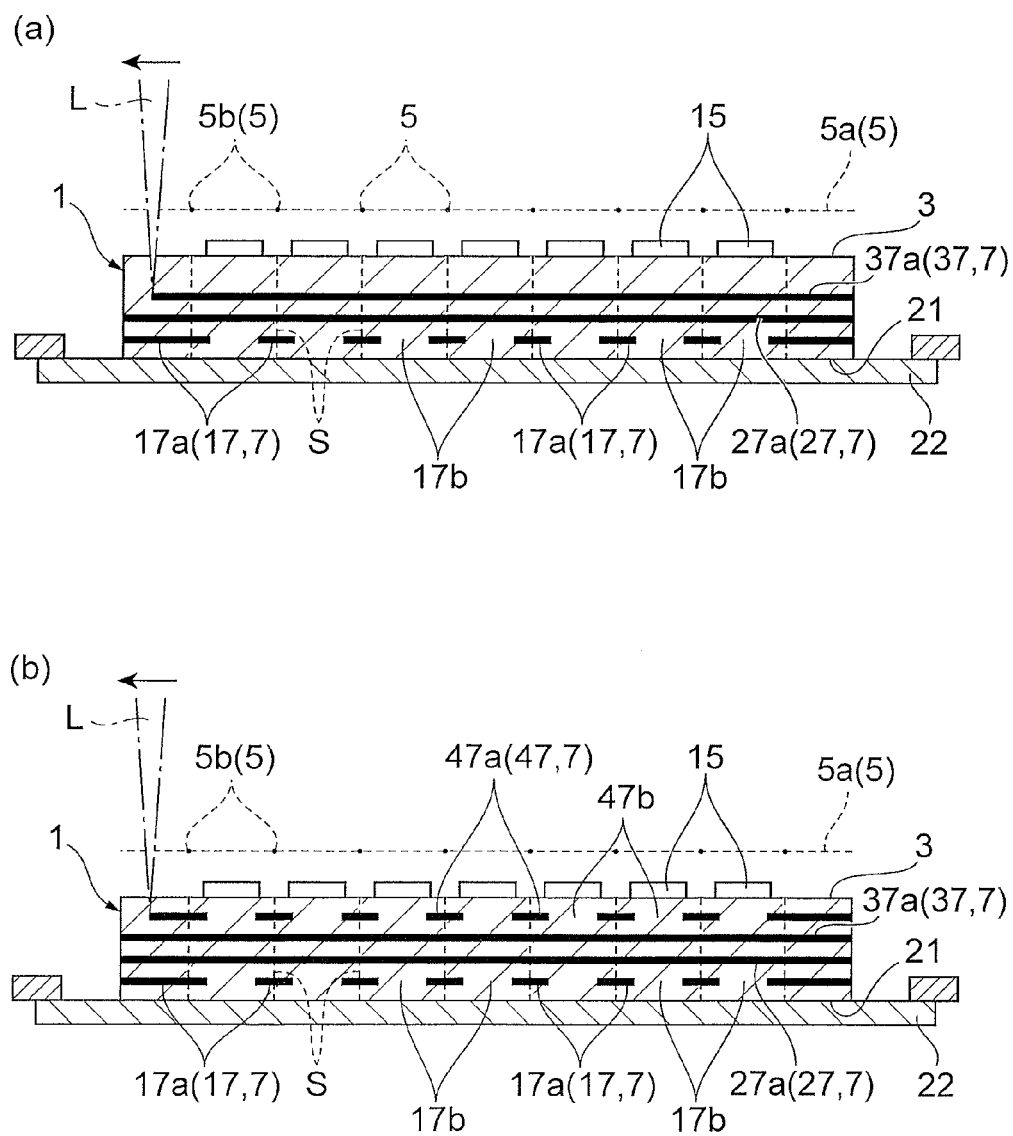
FIG. 9 is a sectional flow diagram for illustrating a sequel to FIG. 8.

Next, while irradiating the object 1 such that the converging point P is located closer to the front face 3 than are the modified regions 17, the laser light L is relatively moved along the lines 5a. This forms the modified regions 27 located at substantially the center in the thickness direction of the object 1 continuously within the object 1 along the lines 5a as illustrated in FIG. 9(a). That is, modified region formed parts 27a which are parts formed with the modified regions 27 are continuously formed so as to exist from one end side of the object 1 to the other end side thereof in the direction extending along the lines 5a.

Subsequently, while irradiating the object 1 such that the converging point P is located closer to the front face 3 than are the modified regions 27, the laser light L is relatively moved along the lines 5a. This forms modified regions 37, located at substantially the center in the thickness direction of the object 1, similar to the modified regions 27 within the object 1 continuously along lines 5a.

Next, while irradiating the object 1 such that the converging point P is located on the front face 3 side of the object 1, the laser light L is relatively moved. This forms modified regions 47 located on the front face 3 side of the object 1 within the object 1 along the lines 5a as illustrated in FIG. 9(b). The modified regions 47 are formed such that modified region formed parts 47a which are parts formed with the modified regions 47 and modified region unformed parts 47b which are formed without the modified regions 47 alternate along the lines 5a.

Figure 10:
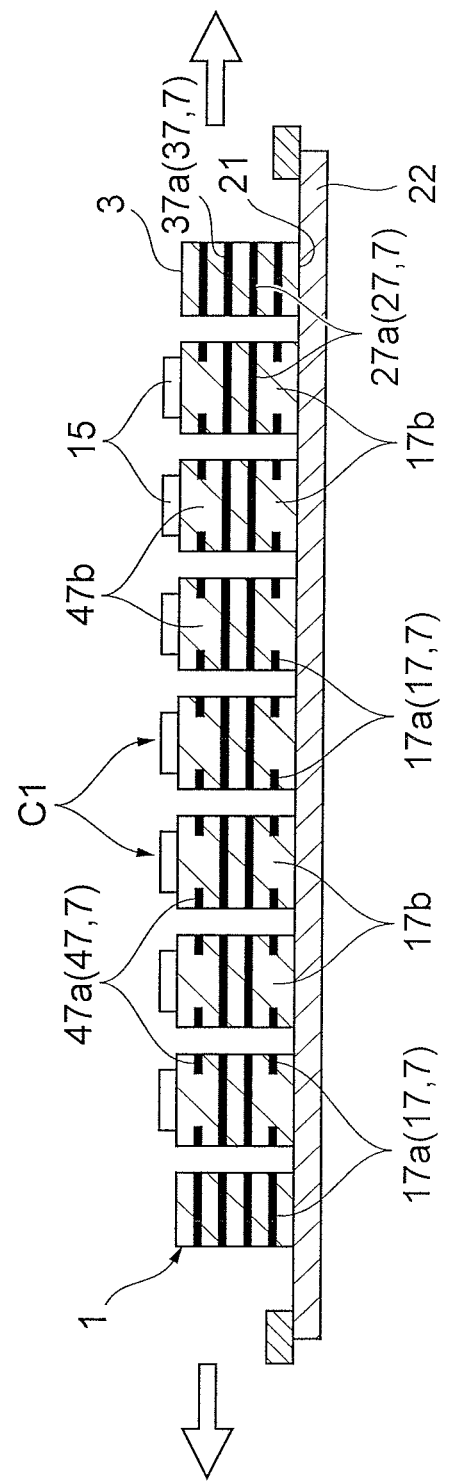
FIG. 10 is a sectional flow diagram for illustrating a sequel to FIG. 9.

Then, as in the forming of the modified regions 17, 27, 37, 47 along the lines 5a mentioned above, the modified regions 17, 27, 37, 47 are formed along the lines 5b. Finally, as illustrated in FIG. 10, the expandable tape 22 is expanded, so as to cut the object 1 into the functional devices 15 along the lines 5 from the modified regions 17, 27, 37, 47 acting as cutting start points. This yields a plurality of semiconductor chips C1 each having a chip size of 5 mm×5 mm, for example.

When the object 1 is thin, for example, the forming of the modified regions 37 may be omitted. When the object 1 is thick, for example, one or a plurality of modified regions similar to the modified regions 27 may further be formed between the modified regions 37, 47. That is, modified regions may appropriately be formed according to the thickness of the object 1 such that at least one row of modified regions 27 is formed between the modified regions 17, 47.

Figure 11:
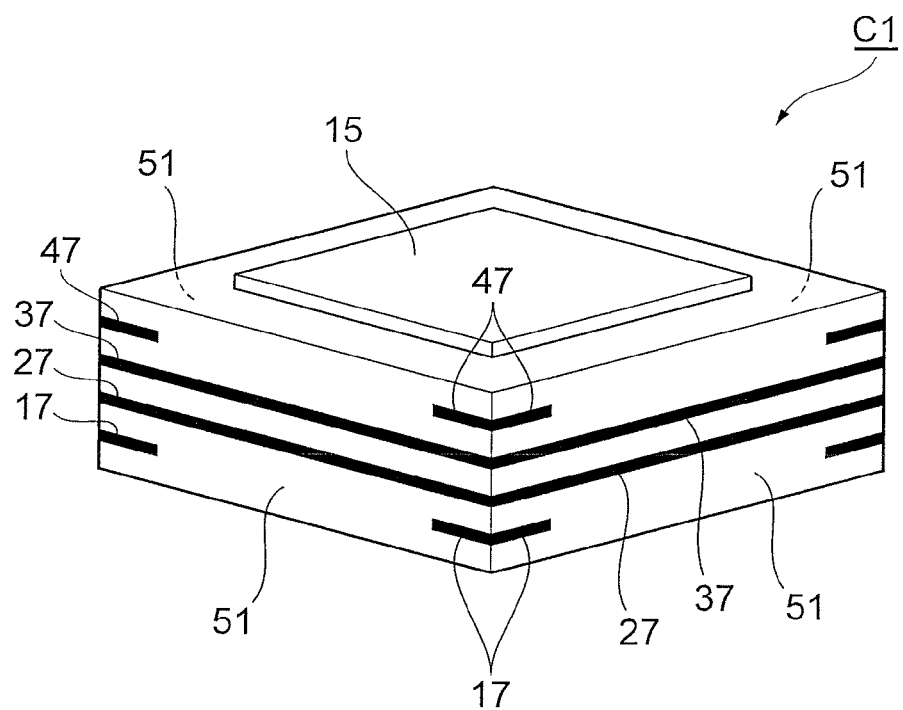
FIG. 11 is a perspective view illustrating a chip obtained by the laser processing method of the first embodiment.

FIG. 11 is a perspective view illustrating a chip obtained by the laser processing method of this embodiment. As illustrated in FIG. 11, the chip C1 presents a square form when seen from the front face 3 and has the functional device 15 formed on the front face 3. In each of side faces 51 of the chip C1, four rows of modified regions 17, 27, 37, 47 aligning in the thickness direction are formed in this order from the rear face 21 side to the front face 3 side. Each of the modified regions 17, 27, 37, 47 extends in each side face 51 in a direction (hereinafter simply referred to as "orthogonal direction") orthogonal to the thickness direction.

The modified regions 17, 47 are located closest to the rear and front faces 21, 3, respectively. The modified regions 17, 47 are formed in left and right end parts (one and the other end parts) in the orthogonal direction in each side face 51 which are etch parts of the chip C1. The modified regions 17, 47 here are provided only in parts corresponding to areas which are free of the functional device 15 in the front face 3 when seen from the side face 51. That is, the part corresponding to the area provided with the functional device 15 in the front face 3 is free of the modified regions 17, 47. The modified regions 27, 37 are located between the modified regions 17, 47 and formed continuously from the left end part of the chip C1 to the right end part thereof in the orthogonal direction in each side face 51.

In this embodiment, the modified regions 17 are formed such that the modified region formed parts 17*a* and modified region unformed parts 17*b* alternate along the lines to cut as in the foregoing. The modified regions 47 are also formed such that the modified region formed parts 47*a* and modified region unformed parts 47*b* alternate along the lines to cut. This can inhibit the strengths on the rear face 21 side and front face 3 side of the chip C1, which are likely to become base points for breakages, from being lowered by the forming of the modified regions. On the other hand, the modified regions 27, 37 located between the modified regions 17, 47 are continuously formed from one end side of the lines to cut 5 to the other end side thereof, whereby the cuttability of the object 1 can be secured reliably. As a result, while the object 1 can be cut reliably, the bending strength of the chips C1 obtained by cutting can be improved.

That is, in this embodiment, the modified regions 17, 47 are formed intermittently such as to provide unformed parts at the positions closest to the rear and front faces 21, 3 of the object 1, while the modified regions 27, 37 are formed continuously such as to be free of unformed parts at positions held between the modified regions 17, 47. This can reduce the parts formed with the modified regions 7 (form the minimum modified regions 7 required for cutting), while keeping the cuttability of the object 1, thereby enhancing the strength such as bending strength of the chip C1 and its rigidity.

As mentioned above, the modified region formed parts 17*a*, 47*a* are formed so as to be located in parts corresponding to between a plurality of functional devices 15 when seen from a lateral side and exist in predetermined parts intersecting the surfaces S to cut the object 1. As a consequence, the modified regions 17, 47 are formed in edge parts (i.e., left and right end parts in the side faces 51) of the resulting chips C1. This makes it possible to secure the straightforwardness of the side faces 51 of the chips C1, which are cut surfaces, so as to inhibit so-called skirts from occurring and improve the quality.

Figure 12:
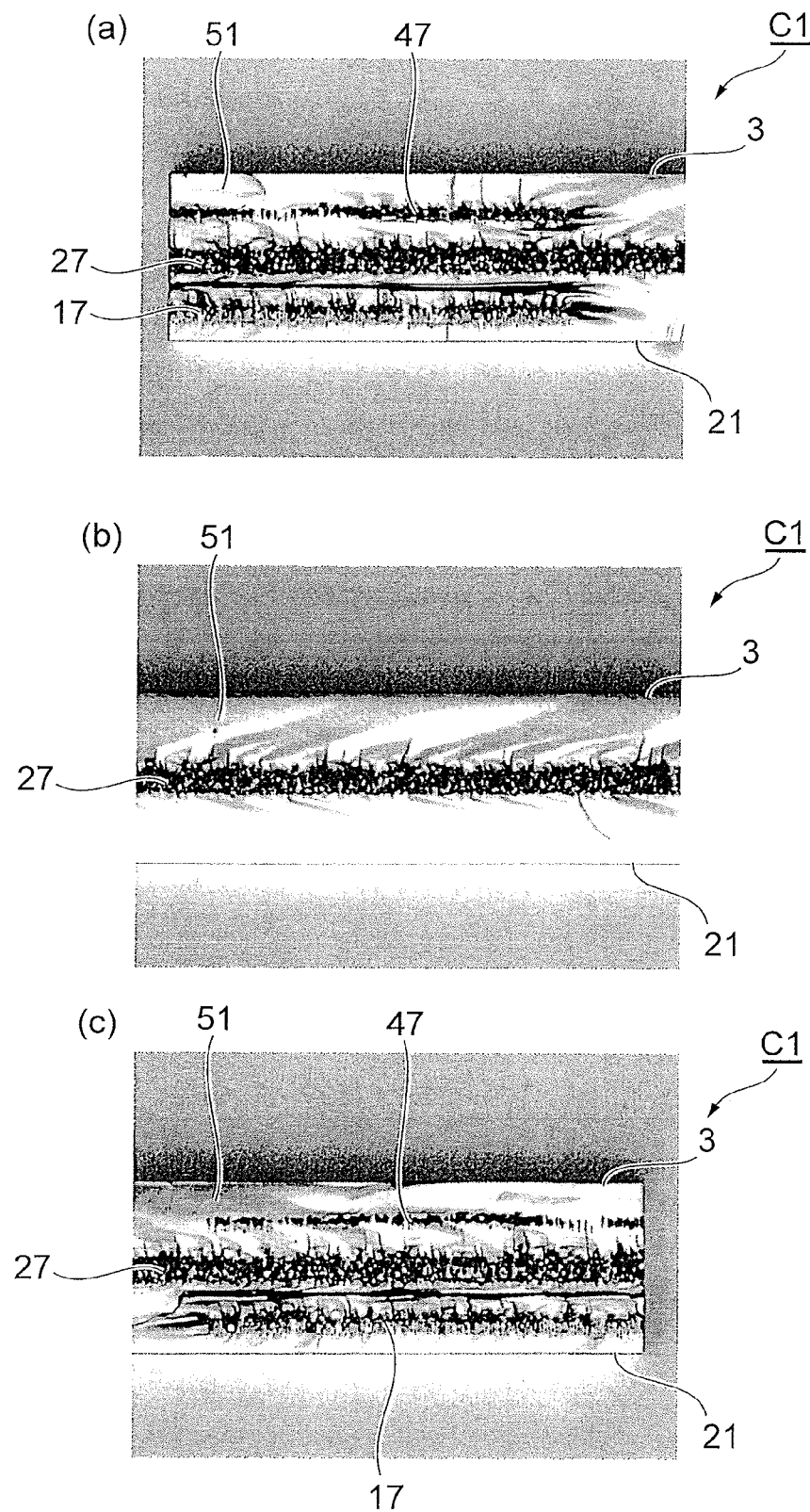
FIG. 12 is an enlarged photographic view illustrating a side face of the chip obtained by the laser processing method of the first embodiment.

FIG. 12 is an enlarged photographic view illustrating a side face of the chip obtained by the laser processing method of this embodiment. The depicted chip C1 has a size of 5 mm×5 mm with a thickness of 200 μm. In FIG. 12, (a), (b), and (c) illustrate the left end, center, and right end parts of the chip C1 in the state where the front face 3 is on the upper side.

When manufacturing the chip C1, three rows of modified regions 17, 27, 47 are formed in the object 1. Specifically, the object 1 is irradiated with the laser light L at a power of 0.5 W while locating the converging point P at a position of 180 μm from the front face 3 so as to form the modified region 17, at a power of 0.72 W while locating the converging point P at a position of 120 μm from the front face 3 so as to form the modified region 27, and at a power of 0.5 W while locating the converging point P at a position of 60 μm from the front face 3 so as to form the modified region 47.

As illustrated in FIG. 12, it is seen that the modified region 17 extending laterally near the rear face 21, the modified region 27 extending laterally at the center part in the thickness direction, and the modified region 47 extending laterally near the front face 3 are formed as three rows aligning in the thickness direction in the side face 51 of the chip C1. It is also seen that the modified regions 17, 47 are formed in the left and right end parts alone and not in the center part in the lateral direction, while the modified region 17 is formed continuously so as to exist from the left end part to the right end part.

In particular, the modified region 17 formed by the first scan is denser than the modified region 47 formed by the subsequent scan (i.e., the modified region 47 is sparser than the modified region 17). This seems to be because fractures and the like generated from the modified region 17 upon forming the latter affect the making of the modified region 47.

FIG. 13 is a chart representing results of bending strength tests for the chip of FIG. 12. In the chart, the conventional chip indicates a chip obtained by conventional laser processing, specifically, one in which three rows of modified regions each continuously formed from the left end part to the right end part in each side face of the chip align in the thickness direction.

These bending strength tests measured the strength in a three-point bend scheme, i.e., the strength at the time when a force was applied with a blade or the like to the chip C1 held by both ends thereof. Employed as a testing machine was Autograph AG-IS (manufactured by Shimadzu Corporation) with a span of 2 mm between blade points. The strength at which the surface (i.e., rear face 21) opposite to the entrance surface opened when a force was applied from the laser light entrance surface (i.e., front face 3) side is represented where "the open surface is the rear face," while the strength at which the entrance surface side opened when a force was applied from the rear face side is represented where "the open surface is the entrance surface."

As FIG. 13 illustrates, it is seen that this embodiment allows the chip C1 to have a bending strength higher than that of the conventional chip. Here, the average value of bending strength is enhanced by 3 times or more and 1.5 times or more when the open surface is the rear face and entrance surface, respectively.

The modified region 17 on the rear face 21 side and the modified region 47 on the front face 3 side seem to effectively contribute to improving the bending strength when the open surface is the rear face and entrance surface, respectively. The bending strength has also been seen to become higher in the chip C1 having a thickness of 300 μm than in the conventional chip as a result of the above-mentioned bending strength tests applied thereto.

In the foregoing, one of the rear and front faces 21, 3 constitutes "one main face," while the other does "the other main face." One of the modified regions 17, 47 constitutes "the first modified region," while the other does "the second modified region." The modified regions 27, 37 constitute "the third modified region."

Second Embodiment

The second embodiment of the present invention will now be explained. This embodiment will be explained mainly in terms of differences from the above-mentioned first embodiment.

Figure 14:
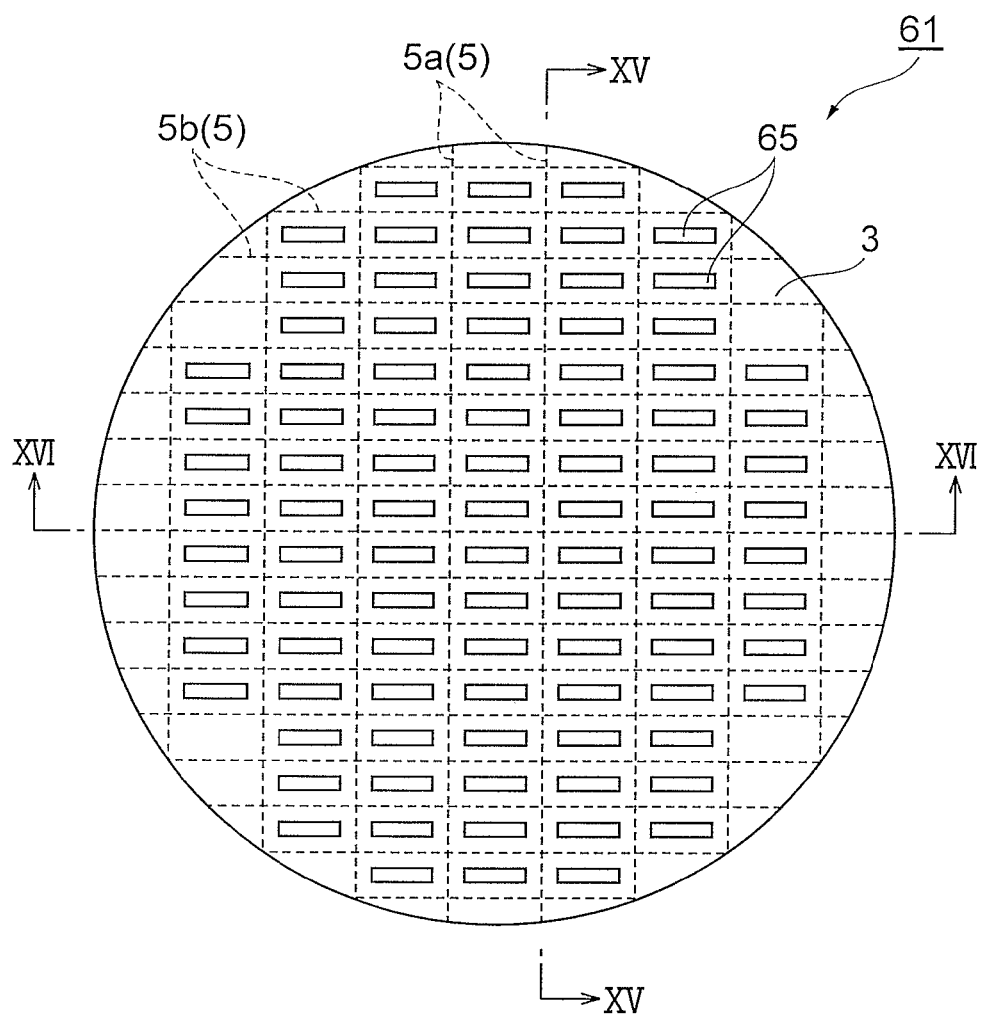
FIG. 14 is a plan view illustrating an object to be processed by the laser processing method of a second embodiment.
Figure 15:
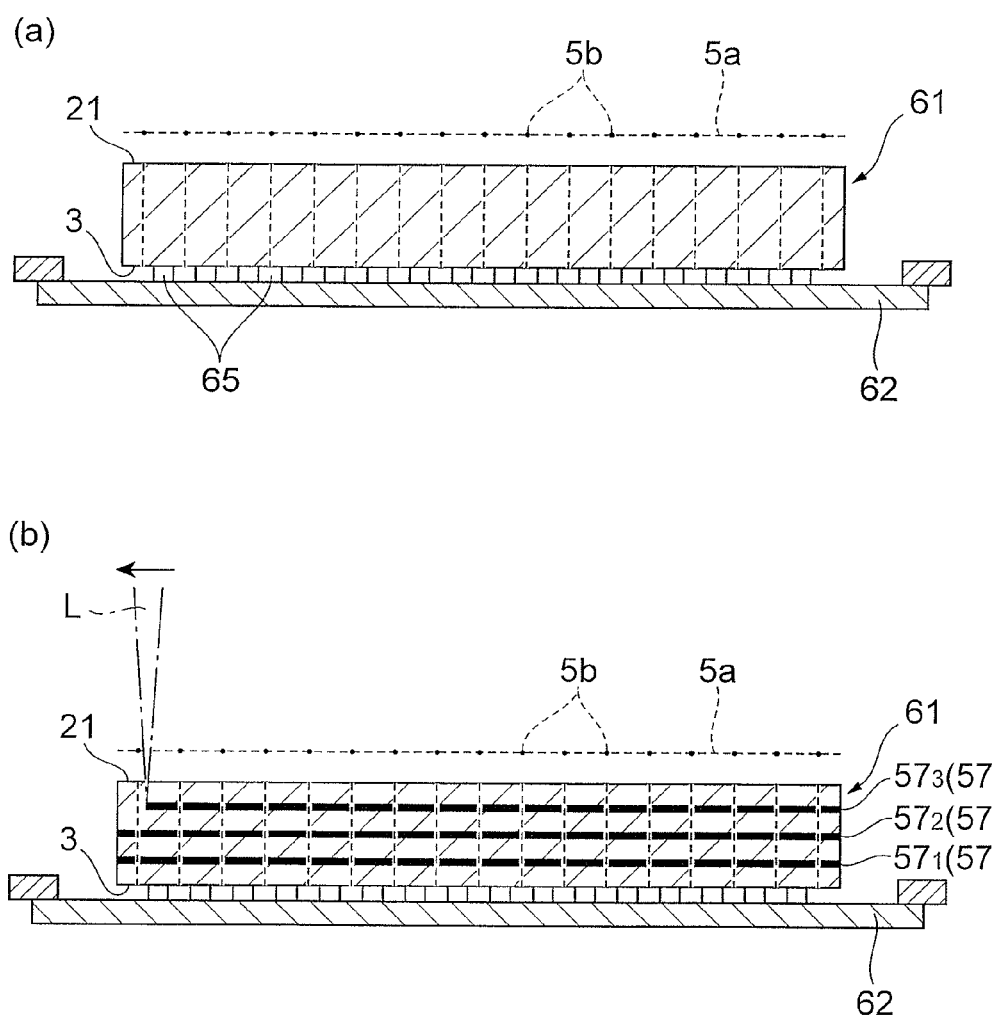
FIG. 15 is a sectional flow diagram taken along the line XV-XV of FIG. 14 for explaining the laser processing method of the second embodiment.

As FIG. 14 illustrates, an object 61 to be processed by the laser processing method of this embodiment has the front face 3 formed with a plurality of functional devices 65. The functional devices 65, each having an elongated rectangular form, are arranged in such a matrix as to have the same longitudinal direction, First, as illustrated in FIG. 15(a), the laser processing method of this embodiment mounts the object 61 having a BG tape 62 attached to its front face 3 side onto the support table 107 (see FIG. 1).

Subsequently, while irradiating the object 61 such that its rear face 21 serves as a laser light entrance surface, the laser light L is relatively moved along lines to cut 5a extending in the lateral direction of the functional devices 65. This step is repeatedly performed while changing the position of the converging point P. This forms three rows of modified regions 57 ($57_1$, $57_2$, $57_3$), which extend along the lines 5 and align in the thickness direction, in this order from the rear face 21 side to the front face 3 side as illustrated in FIG. 8(b).

The modified regions $57_1$, $57_2$, $57_3$ are formed such as to be located on the front face 3 side of the object 61, at substantially the center in the thickness direction thereof, and on the rear face 21 side thereof, respectively. The modified regions $57_1$, $57_2$, $57_3$ are continuously formed so as to exist from one end side of the object 61 to the other end side thereof in the direction along the lines 5a.

Figure 16:
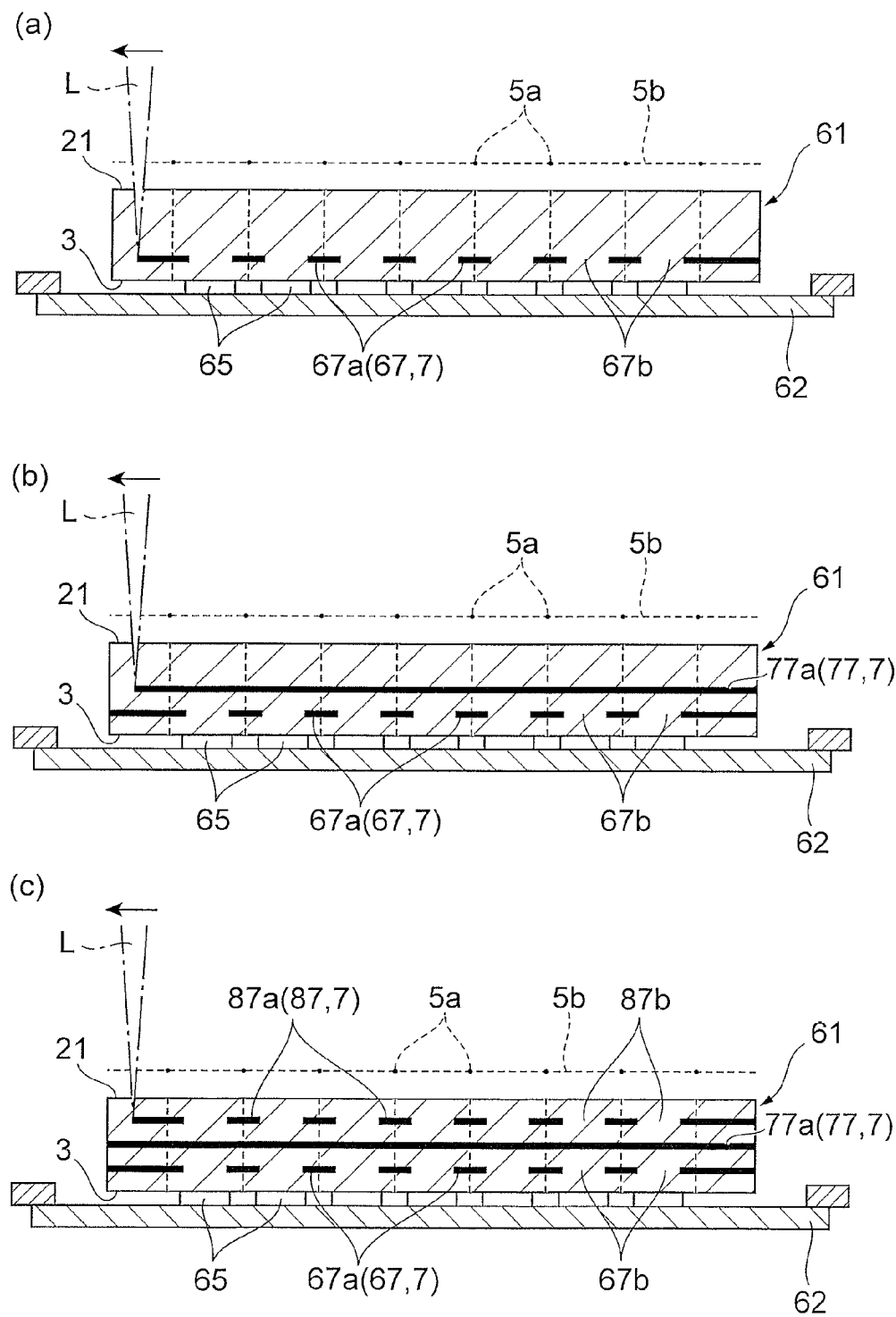
FIG. 16 is a sectional flow diagram taken along the line XVI-XVI of FIG. 14 for illustrating a sequel to FIG. 15.

Next, while irradiating the object 61 such that the converging point P is located on the front face 3 side, the laser light L is relatively moved along lines to cut 5b extending in the longitudinal direction of the functional devices 65. This forms modified regions 67 located on the front face 3 side of the object 61 within the object 61 along the lines 5b as illustrated in FIG. 16(a). Here, the laser light source controller 102 regulates the ON/OFF of the emission of the laser light L, so as to form the modified regions 67 such that modified region formed parts 67a which are parts formed with the modified regions 67 and modified region unformed parts 67b which are parts formed without the modified regions 67 alternate along the lines 5b.

More specifically, when the object 61 is seen from a lateral side, the modified region formed parts 67a are formed so as to exist in parts corresponding to between a plurality of functional devices 65, while the modified region unformed parts 67b are formed so as to exist in parts corresponding to the center parts of the functional devices 65.

Subsequently, while irradiating the object 61 such that the converging point P is located at substantially the center in the thickness direction of the object 61, the laser light L is relatively moved along the lines 5b. This continuously forms modified regions 77 (modified region formed parts 77a) located at substantially the center in the thickness direction of the object 61 such that they exist from one end side of the object 61 to the other end side thereof in the direction along the lines 5b.

Next, while irradiating the object 61 such that the converging point P is located on the rear face 21 side of the object 61, the laser light L is relatively moved. This forms modified regions 87 located on the front face 3 side of the object 61 within the object 61 along the lines 5b as illustrated in FIG. 16(c). The modified regions 87 are formed like the above-mentioned modified regions 67 such that modified region formed parts 87a which are parts formed with the modified regions 87 and modified region unformed parts 87b which are parts formed without the modified regions 87 alternate along the lines 5b.

Figure 18:
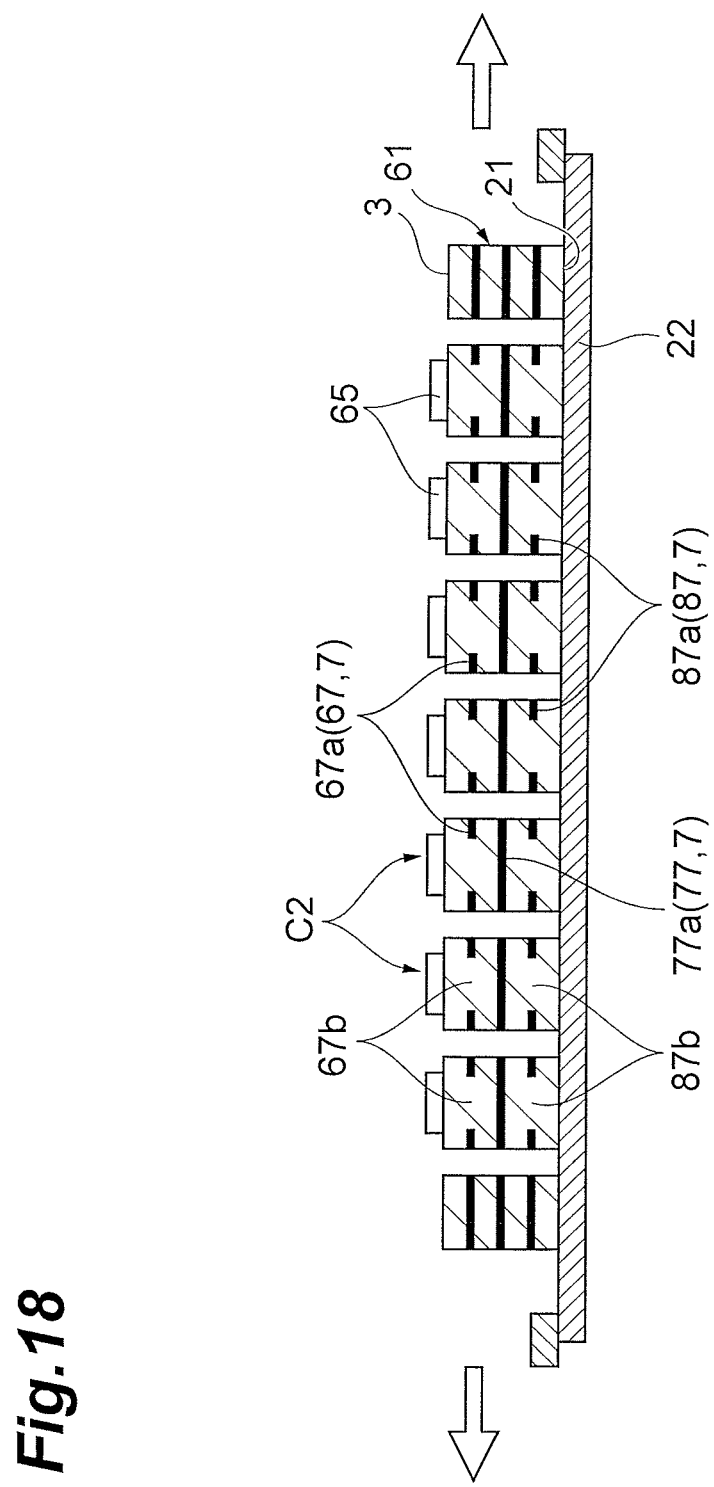
FIG. 18 is a sectional flow diagram for illustrating a sequel to FIG. 17.

Subsequently, an expandable tape 22 is attached and transferred to the rear face 21 of the object 61 as illustrated in FIG. 17 and then expanded as illustrated in FIG. 18, so as to cut the object 61 into the functional devices 65 along the lines 5 from the modified regions 57, 67, 77, 87 acting as cutting start points. This yields a plurality of semiconductor chips C2.

Figure 19:
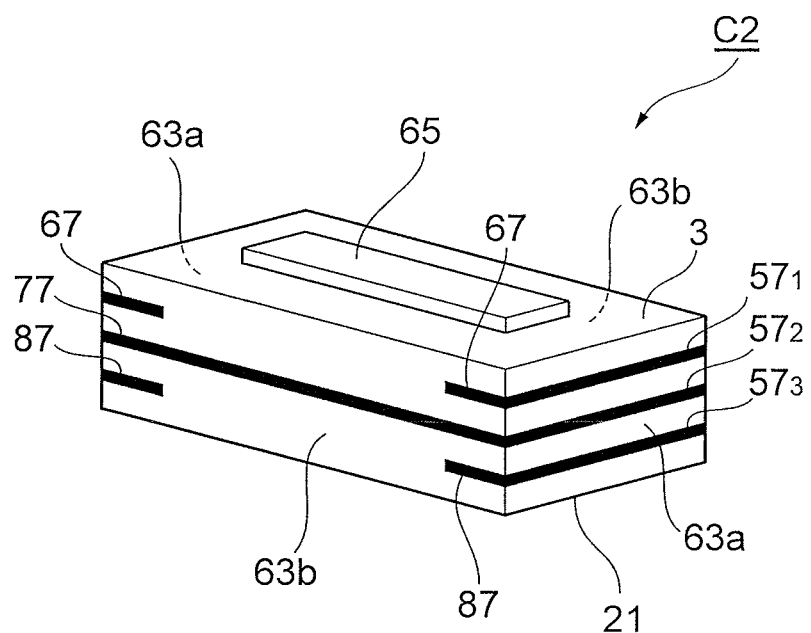
FIG. 19 is a perspective view illustrating a chip obtained by the laser processing method of the second embodiment.

FIG. 19 is a perspective view illustrating a chip obtained by the laser processing method of this embodiment. As illustrated in FIG. 19, the chip C2 presents an oblong form when seen from the front face 3 and has the functional device 15 formed on the front face 3. In each of side faces 63a extending along the lateral direction of the chip C2, three rows of modified regions $57_1$, $57_2$, $57_3$ aligning in the thickness direction are formed in this order from the front face 3 side to the rear face 21 side. Each of the modified regions $57_1$, $57_2$, $57_3$ extends along the orthogonal direction in the side face 63a.

The modified regions $57_1$, $57_2$, $57_3$ are formed such as to be located on the front face 3 side of the side face 63a, substantially at the center in the thickness direction thereof, and on the front face 21 side thereof, respectively. The modified regions $57_1$, $57_2$, $57_3$ are formed continuously so as to exist from one end side of the side face 63a to the other end side thereof in the orthogonal direction.

In each of side faces 63b extending along the longitudinal direction of the chip C2, three rows of modified regions 67, 77, 87 aligning in the thickness direction are formed in this order from the front face 3 side to the rear face 21 side. The modified regions 67, 87 are located closest to the front and rear faces 3, 21, respectively. The modified regions 67, 87 are formed in left and right end parts in the orthogonal direction in each side face 63b which are etch parts of the chip C2. The modified regions 67, 87 here are provided only in parts corresponding to areas which are free of the functional devices 65 in the front face 3 when seen from the side face 63b. That is, the parts corresponding to the areas provided with the functional devices 65 in the front face 3 are formed with none of the modified regions 67, 87. The modified region 77 is located between the modified regions 67, 87 and formed continuously from the left end part of the chip C2 to the right end part thereof in the orthogonal direction in each side face 63b.

As in the foregoing, this embodiment exhibits an effect similar to that mentioned above, i.e., the effect of reliably cutting the object 61 and improving the strength of the chips C2 obtained by cutting.

When the functional devices 65 are elongated, so that the chips C2 obtained by cutting have an elongated form as in this embodiment, the chips C2 are required to improve the strength in their longitudinal direction in particular. In this regard, alternating the modified region formed parts 67a, 87a with the modified region unformed parts 67b, 87b along the longitudinal lines 5b can enhance the bending strength in the longitudinal direction in particular, whereby the above-mentioned effect of improving the strength of the chips C2 can be exhibited effectively.

In the foregoing, one of the modified regions 87 and 67 constitutes "the first modified region," while the other does "the second modified region." The modified region 77 constitutes "the third modified region."

Though preferred embodiments of the present invention have been explained in the foregoing, the present invention is not limited thereto. For example, while the above-mentioned first embodiment employs front illumination in which the laser light L is incident on the front face 3 serving as the laser light illumination surface, back illumination in which the laser light L is incident on the rear face 21 serving as the laser light illumination surface may be used. The above-mentioned second embodiment may employ the front illumination in place of the back illumination.

While the above-mentioned first embodiment forms the modified regions 17, 27, 37, 47 in this order, and the second embodiment does the modified regions 57, 67, 87 in this order, the modified regions can be formed in any desirable order without restriction.

The modified region formed and unformed parts may be formed not only by controlling the ON/OFF of the emission of the laser light L as in the above-mentioned embodiments, but also by opening/closing a shutter disposed on an optical path of the laser light L or masking the front face 3 of the object 1, for example. The modified region formed and unformed parts may also be formed by controlling the laser light L between an intensity at a threshold (processing threshold) or higher and an intensity lower than the processing threshold.

INDUSTRIAL APPLICABILITY

The present invention can reliably cut an object to be processed and improve the strength of the resulting chips.

REFERENCE SIGNS LIST

1, 61 . . . object to be processed; 3 . . . front face; 5, 5*a*, 5*b* . . . line to cut; 7, 17, 27, 37, 47, 57, 67, 77, 87 . . . modified region; 15, 65 . . . functional device; 17*a*, 27*a*, 37*a*, 47*a*, 67*a*, 77*a*, 87*a* . . . modified region formed part; 17*b*, 47*b*, 67*b*, 87*b* . . . modified region unformed part; 21 . . . rear face; 51, 63*b* . . . side face; C1, C2 . . . chip; L . . . laser light; P . . . converging point; S . . . surface to cut

The invention claimed is:

1. A chip having side faces substantially parallel to a thickness direction, and having first and second main faces substantially perpendicular to the thickness direction;

wherein at least one of the side faces is formed with first, second, and third modified regions aligning in the thickness direction and extending in a direction intersecting the thickness direction;

wherein on the at least one side face, the first modified region is formed on a first line that extends in the intersecting direction from one end to an opposing end of the at least one side face and is adjacent to the first main face, the first modified region located at the one end and at the opposing end;

wherein on the at least one side face, the second modified region is formed on a second line that extends in the intersecting direction from the one end to the opposing end of the at least one side face and is adjacent to the second main face, the second modified region located at the one end and at the opposing end; and wherein on the at least one side face, the third modified region is located between the first and second lines and formed to extend from the one end to the opposing end of the at least one side face, and wherein on the at least one side face, the first modified region is not formed in an area between the one end and the opposing end and the second modified region is not formed in an area between the one end and the opposing end.

2. A chip according to claim 1, wherein an area covered by the first modified region and the second modified region on the at least one side face is smaller than an area covered by the third modified region on the at least one side face.

* * * * *